(12) United States Patent
Zhao et al.

(10) Patent No.: US 11,320,695 B2
(45) Date of Patent: May 3, 2022

(54) BACKLIGHT AND LIQUID CRYSTAL DISPLAY

(71) Applicant: ELEC-TECH PHOTOELECTRIC TECHNOLOGY (DALIAN) CO., LTD., Liaoning (CN)

(72) Inventors: Minghai Zhao, Dalian (CN); Shunli Chen, Dalian (CN); Yongchang Sang, Dalian (CN)

(73) Assignee: ELEC-TECH PHOTOELECTRIC TECHNOLOGY (DALIAN) CO., LTD.

( * ) Notice: Subject to any disclaimer, the term of this patent is extended or adjusted under 35 U.S.C. 154(b) by 0 days.

(21) Appl. No.: 17/264,475

(22) PCT Filed: Dec. 29, 2018

(86) PCT No.: PCT/CN2018/125418
§ 371 (c)(1),
(2) Date: Jan. 29, 2021

(87) PCT Pub. No.: WO2020/029534
PCT Pub. Date: Feb. 13, 2020

(65) Prior Publication Data
US 2021/0318576 A1     Oct. 14, 2021

(30) Foreign Application Priority Data

Aug. 9, 2018 (CN) .......... 201821282000.5
Oct. 9, 2018 (CN) .......... 201821634406.5

(51) Int. Cl.
*G02F 1/13357* (2006.01)
*G02F 1/1335* (2006.01)

(52) U.S. Cl.
CPC .. *G02F 1/133603* (2013.01); *G02F 1/133605* (2013.01); *G02F 1/133606* (2013.01); *G02F 1/133614* (2021.01)

(58) Field of Classification Search
None
See application file for complete search history.

(56) References Cited

U.S. PATENT DOCUMENTS 8,568,012 B2 * 10/2013 Park ............ G02B 6/0023
362/612
2008/0064131 A1   3/2008 Chang

FOREIGN PATENT DOCUMENTS

| CN | 101144582 A | 3/2008 |
| CN | 102128391 A | 7/2011 |
| CN | 203351667 U | 12/2013 |

(Continued)

OTHER PUBLICATIONS

International Search Report dated May 5, 2019 in the parent application PCT/CN2018/125418 (5 pages).

*Primary Examiner* — Britt D Hanley
(74) *Attorney, Agent, or Firm* — Polsinelli PC

(57) ABSTRACT

A backlight and a liquid crystal display. The backlight includes: a circuit substrate, a plurality of LED chips and a first silica gel layer. The plurality of LED chips are fixed by means of die bond on the circuit substrate, and the first silica gel layer is applied to the circuit substrate and wraps the plurality of LED chips. The first silica gel layer makes light emitted by the LED chips more diffuse, thus enhancing light emission uniformity of the backlight and reducing a thickness of a backlight module.

14 Claims, 4 Drawing Sheets

(56) References Cited

FOREIGN PATENT DOCUMENTS

| CN | 104979456 A | 10/2015 |
| CN | 108776411 A | 11/2018 |

\* cited by examiner

BACKLIGHT AND LIQUID CRYSTAL DISPLAY

CROSS-REFERENCE TO RELATED APPLICATIONS

This application is a National Phase of International Application PCT/CN2018/125418, filed on Dec. 29, 2018 which claims priority to Chinese Patent Application No. 201821282000.5, filed on Aug. 9, 2018, entitled "BACKLIGHT AND LIQUID CRYSTAL DISPLAY", and Chinese Patent Application No. 201821634406.5, filed on Oct. 9, 2018, entitled "BACKLIGHT AND LIQUID CRYSTAL DISPLAY", the content of which are incorporated herein by reference in their entireties.

TECHNICAL FIELD

The present application relates to the field of planar displays, and more particularly, to a backlight and a liquid crystal display.

BACKGROUND

A liquid crystal display (LCD) is one of the most important display technologies at present. The LCD itself does not have a light-emitting characteristic, and an additional backlight is required to provide light required for the display. The LED is an ideal backlight for the LCD because of its energy-saving and long-life characteristics.

There are mainly two modes of the LED backlights, one is a side-type backlight, and the other is a direct-type backlight, each of which has advantages and disadvantages. Since the number of LED light sources is limited, it is necessary to increase the uniformity of light exiting from the diffusion plate by increasing the distance between the backlight source and the diffusion plate, that is, increasing the optical distance, so as to obtain a uniform surface light source, while the limited number of LED light sources also limits the effect of local dimming of backlight.

Therefore, such a direct type backlight module has a problem that the thickness of the backlight module is relatively thick, the light emission is not uniform, and the adjustment effect of the backlight area is poor.

SUMMARY

Based on this, it is necessary to provide a backlight source and a liquid crystal display in order to solve the problems in the conventional art that a thickness of a backlight module is relatively thick, light emission is not uniform, and an adjustment effect of a backlight area is poor.

A backlight includes a circuit substrate, a plurality of LED chips, and a first silica gel layer. The plurality of LED chips are fixed by means of die bond on the circuit substrate, and the first silica gel layer is applied to the circuit substrate and wraps the plurality of LED chips.

In the backlight provided in this embodiment, the backlight includes the circuit substrate, the plurality of LED chips, and the first silica gel layer. The first silica gel layer makes the light emitted from the LED chips more diffuse, thereby increasing the light emission uniformity of the backlight and reducing the thickness of the backlight module.

In an embodiment, the backlight further includes a phosphor layer applied to the first silica gel layer, and the phosphor layer has a thickness less than 0.15 mm.

In the backlight provided in the present embodiment, the backlight further includes the phosphor layer, so that the light emitted from the LED chips is uniformly illuminates the phosphor layer after being diffused by the first silica gel layer, thereby further improving the light emission uniformity of the backlight.

In an embodiment, a surface of the first silica gel layer is flat, and the surface of the first silica gel layer includes a pattern of trenches. A depth of each of the trenches is less than 0.05 mm.

In an embodiment, the backlight further includes a second silica gel layer disposed on the phosphor layer. The second silica gel layer is a silica gel layer mixed with diffusion powder.

In an embodiment, the first silica gel layer has a silica gel refractive index greater than 1.4, and the first silica gel layer has a thickness greater than 0.2 mm.

In an embodiment, a length of each LED chip is less than 0.5 mm, a width of each LED chip is less than 0.5 mm, and a height of the LED chip is less than 0.2 mm.

In an embodiment, the plurality of LED chips are fixed in an array by means of die bond on the circuit substrate in an array arrangement.

In an embodiment, a distance between adjacent chips of the plurality of LED chips is less than 5 mm.

In an embodiment, the thickness of the circuit substrate is less than 0.5 mm.

A backlight, which includes:
a circuit substrate, a substrate capable of integrating a circuit,
a plurality of LED chips disposed on the circuit substrate and configured to generate a light source,
a reflective film disposed on the circuit substrate and including a plurality of openings corresponding to the plurality of LED chips, and
a diffusing layer disposed on the plurality of LED chips, the diffusing layer including a silica gel layer and a plurality of three-dimensional microstructures disposed on the silica gel layer.

In an embodiment, the diffusing layer includes:
a silica gel layer configured to make light emitted from a plurality of LED chips exit, and
a plurality of three-dimensional microstructures provided in the silica gel layer are configured to disperse the light emitted from the silica gel layer, so that the light exiting from the silica gel layer is more uniform.

In an embodiment, the shape of the three-dimensional microstructure includes one or more of a regular pyramid shape, an inverted pyramid shape, a regular cone shape, and an inverted cone shape. The three-dimensional microstructures are disposed on a surface of the silica gel layer, and the surface of the silica gel layer is away from the LED chip.

In an embodiment, the silica gel layer is a transparent organosilica gel layer, or an organosilica gel layer mixed with phosphor or quantum dots.

In an embodiment, a thickness of the silica gel layer is between 0.1 mm and 1 mm.

In an embodiment, a reflectivity of the reflective film is greater than 90%, and a material of the reflective film includes a polymer or metal.

In an embodiment, the plurality of LED chips are distributed in a rectangular array, a circular array, or a special-shaped array on the circuit substrate.

In an embodiment, a distance between any two adjacent LED chips of the plurality of LED chips is between 0.1 mm and 10 mm.

In an embodiment, the LED chip has a length of between 0.05 mm and 0.5 mm, a width of between 0.05 mm and 0.5 mm, and a thickness of between 0.05 mm and 0.3 mm.

A liquid crystal display includes:

a display panel for displaying various information such as text, graphics, images, animations, videos, and video signals, and a backlight module provided at the back of the liquid crystal display for providing a light source having sufficient brightness and uniform distribution, so that the display panel can normally display an image.

In an embodiment, the liquid crystal display includes a display panel and a backlight module. The backlight module includes the backlight provided in the described embodiments.

A liquid crystal display includes a display panel and any one of the backlights provided in the described embodiments.

DETAILED DESCRIPTION OF THE EMBODIMENTS

In order that the objectives, technical solutions, and advantages of the present application may be clearer and better understood, the present application will be further described in detail below with reference to the accompanying drawings and examples. It should be understood that the specific embodiments described herein are merely illustrative of the present application, but not intended to limit the present application.

A backlight and a liquid crystal display provided in the embodiments of the present application can be applied to the field of planar display. The direct type backlight in the conventional art needs to increase the optical distance, so as to obtain a uniform surface light source, and the relatively large light mixing distance causes a problem that the backlight module is relatively thick and does not emit light uniformly. In addition, the number of LEDs of the conventional direct type backlight is limited, and the effect of adjusting the backlight area is limited. The backlight and the liquid crystal display provided by the embodiments of the present application are intended to solve the above technical problems in the conventional art.

Figure 1:
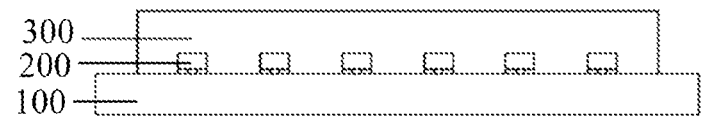
FIG. 1 is a schematic diagram illustrating a backlight of an embodiment.

FIG. 1 is a schematic diagram illustrating a backlight of an embodiment. As shown in FIG. 1, the backlight 10 includes a circuit substrate 100, a plurality of LED chips 200, and a first silica gel layer 300. The plurality of LED chips 200 are fixed by means of die bond on the circuit substrate 100, and the first silica gel layer 300 is applied to the circuit substrate 100 and wraps the plurality of LED chips 200.

In the present embodiment, the circuit substrate 100 may be integrated with a driving circuit or an external driving circuit, and the driving circuit can drive a plurality of LED chips 200. The plurality of LED chips 200 may be driven integrally, according to region, or one by one. Optionally, the circuit substrate 100 may be a soft substrate or a hard substrate. The plurality of LED chips 200 are configured to generate a light source. The plurality of LED chips are disposed on the circuit substrate 100. Optionally, the LED chip 200 may be a flip chip, a horizontal chip, or a vertical chip. The first silica gel layer 300 is configured to disperse light emitted from the plurality of LED chips 200. The first silica gel layer 300 is applied to the circuit substrate 100 and wraps the plurality of LED chips 200. Optionally, the silica gel used for the first silica gel layer 300 may be transparent silica gel, or silica gel mixed with diffusion powder. Optionally, the silica gel may be applied by means of dispensing, film pressing, or steel screen printing.

The backlight provided in this embodiment includes the circuit substrate, the plurality of LED chips, and the first silica gel layer. The plurality of LED chips are disposed on the circuit substrate, the first silica gel layer is applied to the circuit substrate and wraps the plurality of LED chips, and the light emitted from the LED chips is diffused by the first silica gel layer, so that the light emission is more uniform, and the light emission uniformity of the backlight is increased. Moreover, the cured first silica gel layer can protect the plurality of LED chips fixed by means of die bond on the circuit substrate, and prevent the plurality of LED chips from falling under action of an external force.

Figure 2:
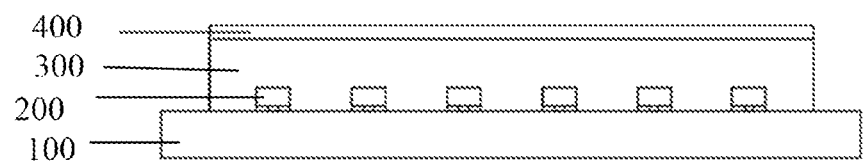
FIG. 2 is a schematic diagram illustrating a backlight of an embodiment.

FIG. 2 is a schematic diagram illustrating a backlight of an embodiment. As shown in FIG. 2, the backlight 10 may further include a phosphor layer 400 applied to the first silica gel layer 300, and the phosphor layer 400 may have a thickness less than 0.15 mm.

Specifically, the first silica gel layer 300 is coated with phosphor to obtain a phosphor layer 400 with a thickness less than 0.15 mm, so that the light emitted from the plurality of LED chips 200 uniformly illuminates the phosphor layer 400 after being diffused by the first silica gel layer 300. The phosphor is activated to emit yellow light, green light, or red light, which mix with the remaining blue light to generate white light, thereby obtaining a white light backlight 10 having uniform light emission. Optionally, the phosphor layer 400 may be applied by means of spraying, or applying a phosphor film.

In the present embodiment, the phosphor layer applied to the first silica gel layer causes the light emitted from the LED chip to uniformly illuminate the phosphor layer after being diffused by the first silica gel layer, so that the phosphor is more uniformly activated, thereby further improving the light emission uniformity of the backlight.

In an embodiment, the backlight 10 further includes a second silica gel layer disposed on the phosphor layer 400, and the second silica gel layer is a silica gel layer mixed with diffusion powder.

Specifically, the second silica gel layer mixed with the diffusion powder may be disposed on the phosphor layer 400, thereby further dispersing the light and changing directions thereof, and improving the light emission uniformity of the backlight.

Figure 3:
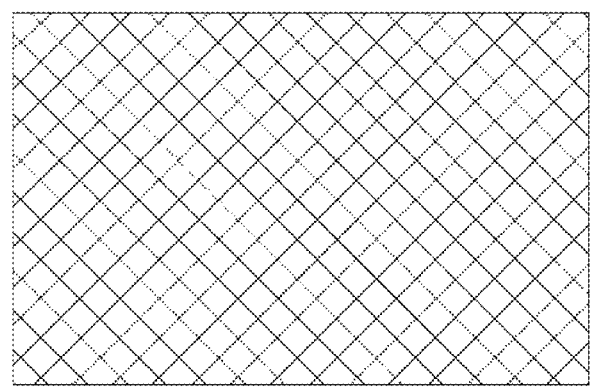
FIG. 3 is a diagram illustrating a pattern of trenches on a surface of a first silica gel layer according to an embodiment.
Figure 4:
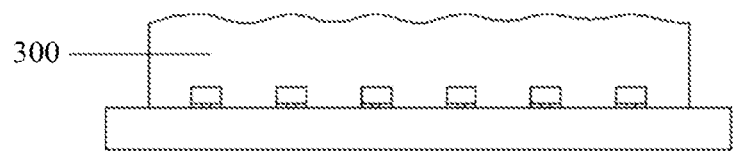
FIG. 4 shows a cured first silica gel layer of an embodiment.
Figure 5:
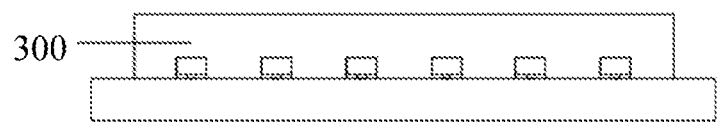
FIG. 5 shows a first silica gel layer with a smooth surface according to an embodiment.

FIG. 3 is a diagram illustrating a pattern of trenches on a surface of a first silica gel layer according to an embodiment, FIG. 4 shows a cured first silica gel layer of an embodiment, and FIG. 5 shows a first silica gel layer with a smooth surface according to an embodiment. In an embodiment, referring to FIGS. 3, 4, and 5 together, the surface of the first silica gel layer 300 is flat, and the surface of the first silica gel layer 300 includes a pattern of trenches; a depth of each trench is less than 0.05 mm; and the first silica gel layer 300 has a silica gel refractive index greater than 1.4 and a thickness greater than 0.2 mm.

Specifically, silica gel having a refractive index greater than 1.4 and a thickness greater than 0.2 mm is applied to the circuit substrate 100. After the first silica gel layer 300 is cured, the first silica gel layer 300 is treated by a grinding process to obtain a first silica gel layer 300 having a flat surface, a roughened surface, and a reduced thickness. Further, interlacing trenches can be etched on the surface of the polished and roughened first silica gel layer 300 by using a V-shaped mechanical cutter. The first silica gel layer 300 is patterned by the V-shaped trenches, and the depth of each trench is less than 0.05 mm. Optionally, the V-shaped trenches may form a miniature pattern such as a triangle, a rectangle, or a diamond.

In the present embodiment, the surface of the first silica gel layer treated by the polishing process is smooth, roughened, and thinned, and the first silica gel layer with the smooth and roughened surface may disperse the light exiting from the surface of the first silica gel layer and change directions thereof, so that the emitted light is more uniform. The first silica gel layer with a reduced thickness can reduce the thickness of the backlight module. The surface of the first silica gel layer is patterned by the V-shaped trenches, so that light emitted from the surface of the silica gel is further homogenized, and the light emission uniformity of the backlight is increased.

Figure 6:
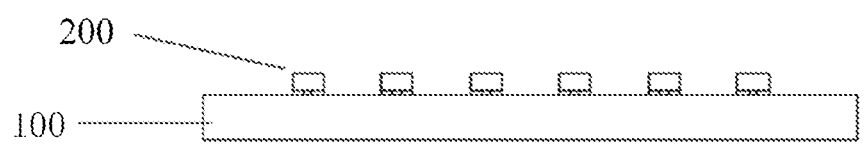
FIG. 6 shows a circuit substrate on which a plurality of LED chips are fixed by means of die bond according to an embodiment.

FIG. 6 shows a circuit substrate on which a plurality of LED chips are fixed by means of die bond according to an embodiment. Optionally, in an embodiment, referring to FIG. 6, a length of the LED chip 200 is less than 0.5 mm, a width of the LED chip 200 is less than 0.5 mm, and a height of the LED chip 200 is less than 0.2 mm. Specifically, a plurality of LED chips 200 are fixed by means of die bond on the circuit substrate 100, and each LED chip 200 has a length less than 0.5 mm, a width less than 0.5 mm, and a height less than 0.2 mm.

In the present embodiment, each LED chip has the length less than 0.5 mm, the width less than 0.5 mm, and the height less than 0.2 mm. A smaller LED chip needs a lower operating current, which helps to improve the light-emitting efficiency of the chip and reduces the power consumption of the backlight module.

Optionally, in an embodiment, also referring to FIG. 6, the plurality of LED chips 200 are disposed in an array by means of die bond on the circuit substrate 100, and a distance between adjacent LED chips 200 is less than 5 mm. The thickness of the circuit substrate 100 is less than 0.5 mm.

Specifically, the plurality of LED chips 200 are disposed by means of die bond on the circuit substrate 100 having the thickness less than 0.5 mm, and the distance between the adjacent LED chips 200 is less than 5 mm. The plurality of LED chips 200 are arranged in the array on the circuit substrate 100. Optionally, the plurality of LED chips 200 may be arranged in a rectangular array on the circuit substrate 100, or may be arranged in a circular array or a special-shaped array on the circuit substrate 100.

In the present embodiment, the plurality of LED chips are fixed in the array be means of die bond on the circuit substrate, and the distance between the adjacent LED chips is less than 5 mm. The light emitting density over the plurality of LED chips is much greater than the light emitting density at the space between two adjacent chips. The cured first silica gel layer can increase the extraction rate of light emitted from the chips, so that the light emitted from the chips is more diffuse, the dark area between adjacent chips is reduced, and the light emission uniformity of the backlight source is increased. In addition, the circuit substrate with the thickness less than 0.5 mm makes the thickness of the backlight reduced.

Figure 7:
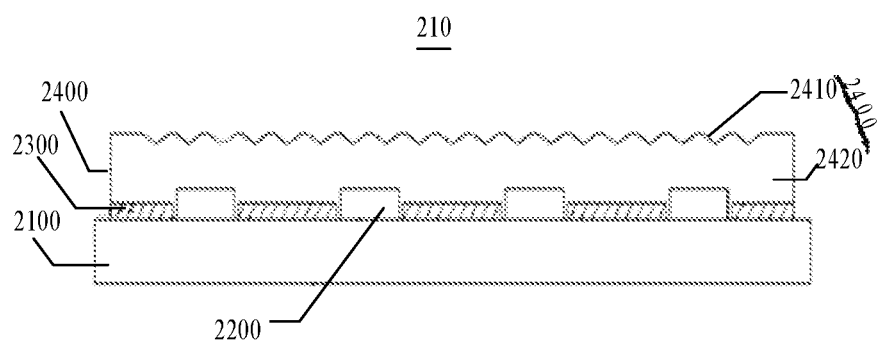
FIG. 7 is a schematic diagram illustrating a backlight of an embodiment.

Referring to FIG. 7, an embodiment of the present application provides another backlight 210 that includes a circuit substrate 2100, a plurality of LED chips 2200, a reflective film 2300, and a diffusing layer 2400. The plurality of LED chips 2200 are disposed on the circuit substrate 2100 to generate a light source. The reflective film 2300 is disposed on the circuit substrate 2100. The reflective film 2300 includes a plurality of openings. The diffusing layer 2400 is provided on the plurality of LED chips 2200 to diffuse the light emitted from the plurality of LED chips 2200, so as to homogenize the light emitted from the backlight 210.

In this embodiment, the reflective film 2300 is configured to increase the reflectivity and increase the light utilization rate. Moreover, the backlight 210 operates at a low driving current by means of the plurality of LED chips 2200, thereby increasing the light emitting efficiency of the LEDs, reducing the power of the backlight module and reducing the energy consumption. The circuit substrate 2100 may be integrated with a driving circuit or an external driving circuit, and the LED chip 2200 may be driven by the driving circuit integrally, according to region, or one by one, so as to realize a backlight region adjusting function.

The plurality of LED chips 2200 are configured to generate a light source. The plurality of LED chips 2200 are disposed on the circuit substrate 2100. In the present application, the connection manner of the plurality of LED chips 2200 is not limited, and can be selected according to actual requirements.

The reflective film 2300 is configured to reflect the light of the LED chip, which illuminates on the reflective film 2300, so that the light exits from the silica gel layer to increase the utilization rate of the light. The reflective film 2300 is disposed on the circuit substrate 2100 and includes a plurality of openings corresponding to the arranged plurality of LED chips 2200. The reflective film 2300 may be adhered to the circuit substrate 2100, or may be applied to the surface of the circuit substrate 2100.

The diffusing layer 2400 includes a silica gel layer 2420 and a plurality of three-dimensional microstructures 2410 disposed on the surface of the silica gel layer 2420. The plurality of three-dimensional microstructures 2410 of the diffusing layer 2400 are configured to disperse the light exiting from the silica gel layer 2420 and change directions thereof. Therefore, the light utilization rate and the light emission uniformity of the backlight 210 can be increased by means of the reflective film 2300 and the diffusing layer 2400.

It may be appreciated that the plurality of three-dimensional microstructures 2410 may be formed as a continuous integral structure with the silica gel layer 2420. That is, a material of each three-dimensional microstructure 2410 is the same as the silica gel layer 2420, and the three-dimensional microstructures 2410 are bonded seamlessly with the silica gel layer 2420. The material of each of the plurality of three-dimensional microstructures 2410 may be different from the material of the silica gel layer 2420, and the plurality of three-dimensional microstructures 2410 are disposed on the surface of the silica gel layer 2420.

The plurality of LED chips 2200, the reflective film 2300, and the diffusing layer 2400 are all disposed on the circuit substrate 2100. The plurality of LED chips 2200 are fixed by mean of die bond on the circuit substrate 2100 to provide a light source. The reflective film 2300 is adhered to the circuit substrate 2100 to improve reflectivity and increase the light utilization rate. The diffusing layer 2400 enables the backlight to emit uniform light.

In the described embodiment, in one respect, the backlight 210 increases the reflectivity by providing the reflective film 2300, thereby increasing the light utilization rate. In another respect, by providing the diffusing layer 2400 with the silica gel layer 2420 and the plurality of three-dimensional microstructures 2410, the directions of the light exiting from the silica gel layer 2420 are changed, so that the light emission is more uniform.

Referring to FIG. 7, in an embodiment, the diffusing layer 2400 includes a three-dimensional microstructure 2410 disposed on a surface of the silica gel layer 2420, which is away from the LED chip 2200. The three-dimensional microstructure 2410 is configured to disperse the light exiting from the silica gel layer 2420 and change directions thereof, so that the light exiting from the silica gel layer 2420 is more uniform. The shape of the three-dimensional microstructure 2410 includes one or more of a regular pyramid shape, an inverted pyramid shape, a regular cone shape, and an inverted cone shape, which may be selected specifically according to actual requirements and is not specifically limited in the present application, as long as the light exiting from the silica gel layer 2420 can be dispersed and the directions thereof are changed, so that the light exiting from the silica gel layer 2420 is more uniform.

In an embodiment, the silica gel layer 2420 may be a transparent silicone gel layer or may be a silicone gel layer mixed with phosphor or quantum dots. The phosphor or the quantum dots can change the color of the light emitted by the LED chip 2200. For example, the phosphor or the quantum dots can absorb blue light emitted by the LED chip 2200 and generate yellow light, green light, or red light after being activated. The activated light is mixed with the remaining blue light to produce white light. It may be appreciated that a formulation of the phosphor or the quantum dots is regulated according to desired properties of the light source, and is not specifically limited herein.

In an embodiment, the silica gel layer 2420 has a thickness of 0.1 mm-1 mm. The thicker the silica gel layer, the more uniform the emitted light, thus the thickness of the backlight 210 becomes thicker correspondingly, which eventually results in an increase in a thickness of a terminal display device using the backlight 210. Specifically, the silica gel layer may have a thickness between 0.1 mm and 0.5 mm. The thickness of the silica gel layer is not specifically limited in the present application, and a specific thickness of the silica gel layer may be determined within a given thickness range according to actual requirements.

In an embodiment, the plurality of LED chips 2200 may be arranged in a rectangular array, a circular array, or a special-shaped array on the circuit substrate 2100. The array distribution of the plurality of LED chips 2200 is not specifically limited in the present application, and may be specifically selected according to actual requirements to realize uniform light emission.

In this embodiment, the distance between any two adjacent LED chips in the plurality of LED chips 2200 is between 0.1 mm and 10 mm, and the plurality of LED chips 2200 are fixed by means of die bond on the circuit substrate 2100. The distance between any two adjacent LED chips is not specifically limited in this application, and may be adjusted according to a size and performance requirements of the integrated backlight.

In an embodiment, each of the plurality of LED chips 2200 has a length between 0.05 mm and 0.5 mm, a width between 0.05 mm and 0.5 mm, and a thickness between 0.05 mm and 0.3 mm. The operating current of a single LED chip is between 0.01 mA and 1 mA, for example between 0.02 mA and 0.2 mA. The lower operating current helps to improve the light-emitting efficiency of the chip and reduce the power consumption of the backlight module.

In an embodiment, the reflective film 2300 has a reflectivity greater than 90%.

In this embodiment, a material of the reflective film 2300 may be a polymer or a metal. Specifically, the reflective film 2300 may be a high-reflectivity polymer film, such as a PET reflective film, or may be a metal film, such as an aluminum film.

Figure 8:
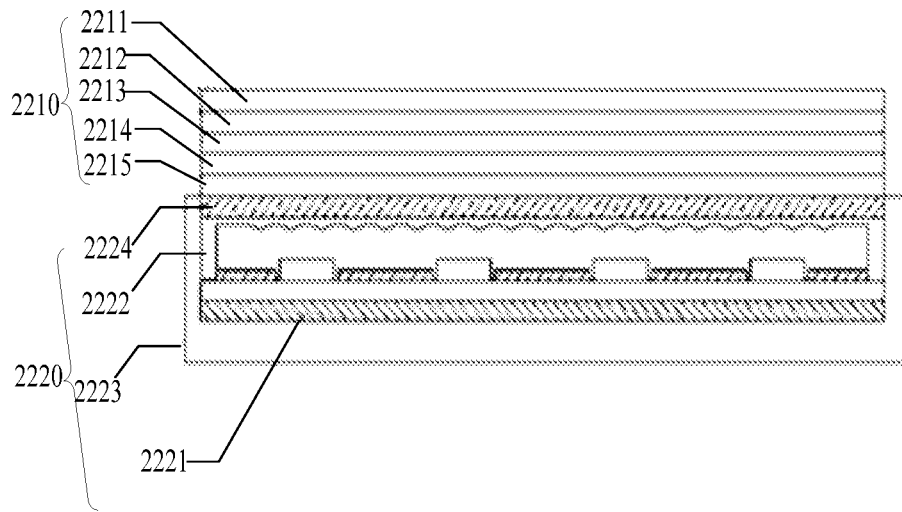
FIG. 8 is a schematic diagram illustrating a liquid crystal display provided with the backlight according to an embodiment.

Referring to FIG. 8, an embodiment of the present application provides a liquid crystal display including a display panel 2210 and a backlight module 2220. The display panel 2210 and the backlight module 2220 may be stacked together. The display panel 2210 includes an upper polarizer 2211, a filter plate 2212, a liquid crystal layer 2213, an array substrate 2214, and a lower polarizer 2215, all of which are stacked in sequence, and the lower polarizer 2215 is adjacent to the backlight module 2220. The backlight module 2220 includes a module back plate 2221 and a backlight 2222. The module back plate 2221 is configured to support the backlight 2222, and the backlight 2222 may be disposed between the module back plate 2221 and the display panel 2210. The structure of the backlight 2222 may be the same as that of the backlight 210 provided in any of the above embodiments.

In an embodiment, the liquid crystal display 20 may further include a diffusing plate 2224 for further diffusing the light emitted from the backlight 2222 so that the light is more uniform. The diffusing plate 2224 may be disposed on the light emitting surface of the backlight 2222, and specifically, the diffusing plate 2224 may be disposed on the surface of the light diffusing layer in the backlight 2222.

In an embodiment, the liquid crystal display 20 may also include a heat dissipation plate 2223 for dissipating heat of the backlight 2222. The heat dissipation plate 2223 may be disposed around the backlight 2222, so as to facilitate rapid heat dissipation. Specifically, the heat dissipation plate 2223 may be provided on the surface of the module back plate 2221.

Figure 9:
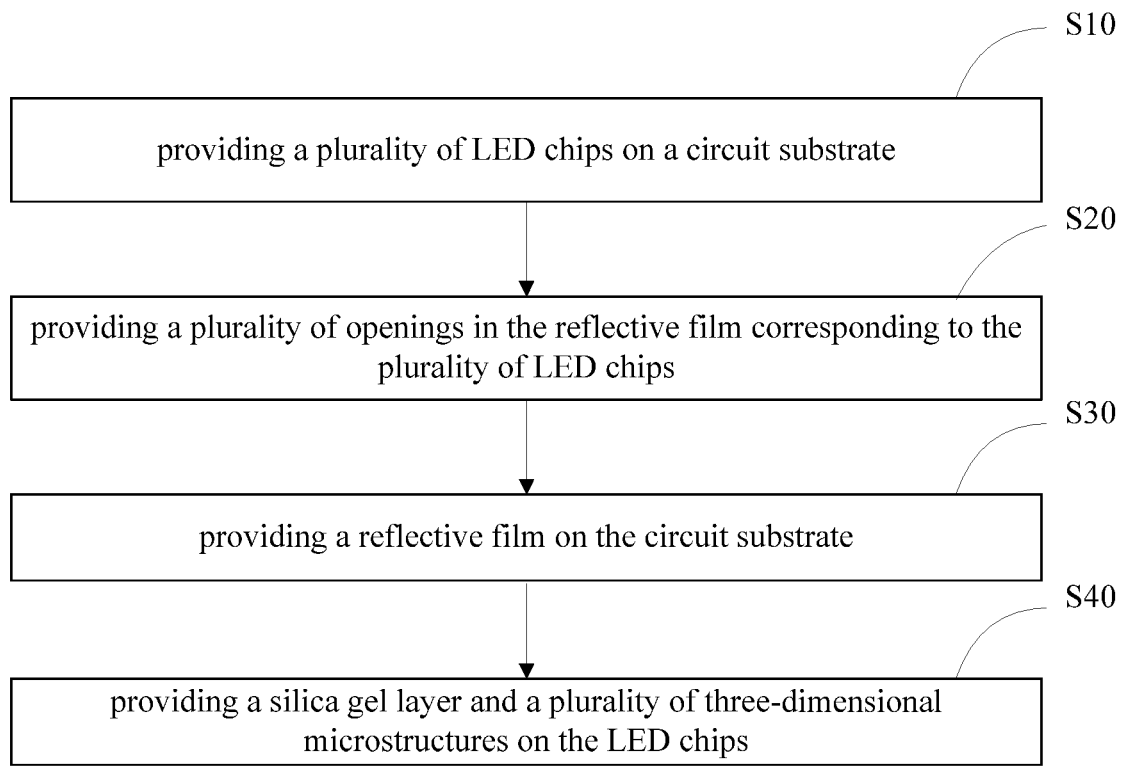
FIG. 9 is a flow chart of a method for manufacturing a backlight according to an embodiment.

Referring to FIG. 9, an embodiment of the present application provides a method for manufacturing the backlight 2222, including:

step S10, providing a plurality of LED chips 2200 on a circuit substrate 2100;

step S20, providing a plurality of openings in the reflective film 2300 corresponding to the plurality of LED chips;

step S30, providing a reflective film 2300 on the circuit substrate 2100; and step S40, providing a silica gel layer 2420 and a plurality of three-dimensional microstructures 2410 on the LED chips.

In the described embodiment, by providing the reflective film and the silica gel layer functioning as a diffusing layer, and forming the plurality of three-dimensional microstructures on the surface of the silica gel layer, the light utilization rate and the light emission uniformity of the backlight can be increased, thereby enabling the liquid crystal display to display an image normally. Moreover, the LED chip is fixed by means of die bond first, and then the reflective film is adhered, thus the reflection effect can be effectively improved, and the light utilization rate can be increased.

Figure 10:
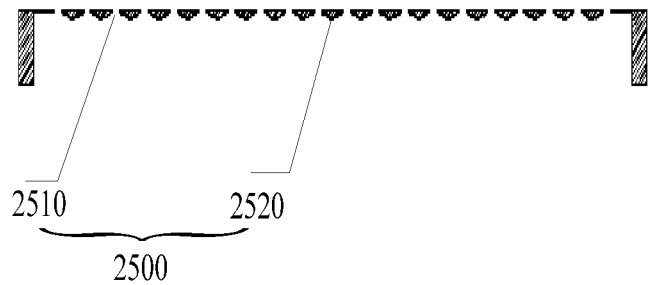
FIG. 10 is a schematic structural diagram illustrating a mask layer of an embodiment.
Figure 11:
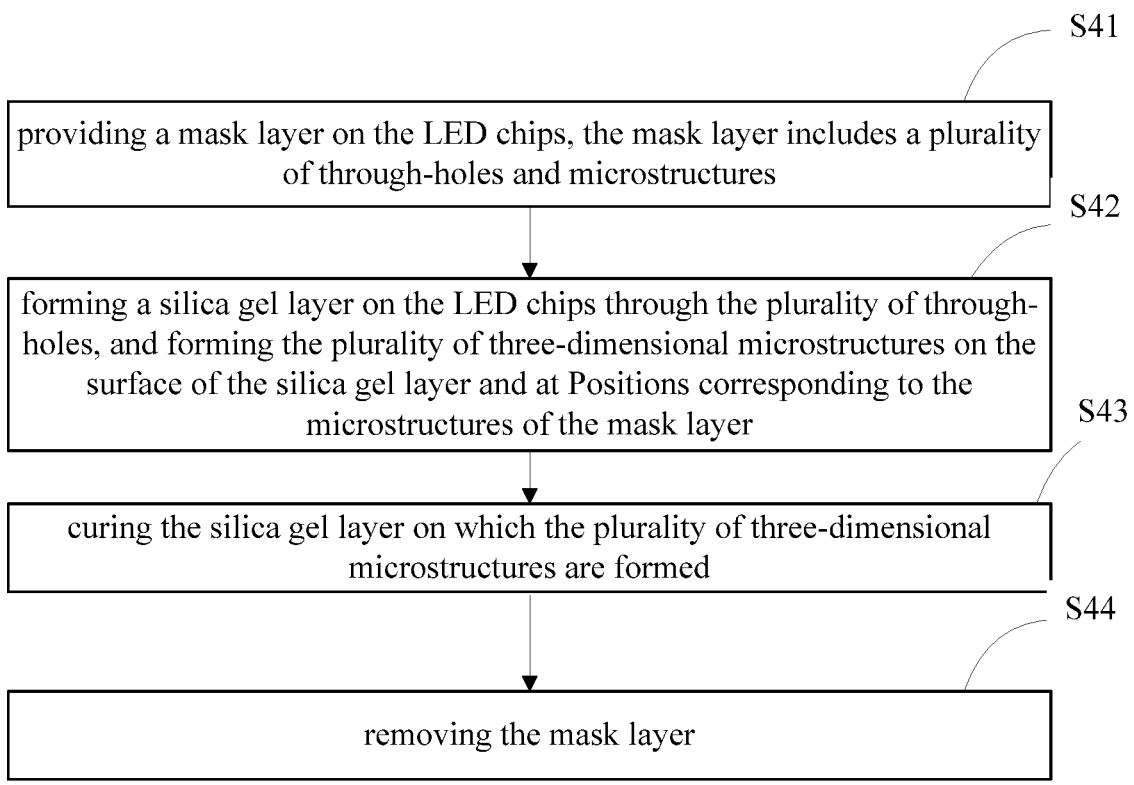
FIG. 11 is a flow chart of steps for providing a silica gel layer and a plurality of three-dimensional microstructures according to an embodiment.

Referring to FIGS. 10 and 11 together, in an embodiment, in order to diffusing light, the step S40 of providing the silica gel layer 2420 and the plurality of three-dimensional microstructures 2410 on the LED chips includes:

step S41, providing a mask layer 2500 on the LED chips 2200, the mask layer 2500 having a plurality of through-holes 2510 and microstructures 2520.

step S42, forming a silica gel layer 2420 on the LED chips through the plurality of through-holes, and forming the plurality of three-dimensional microstructures 2410 on the surface of the silica gel layer 2420 and at positions corresponding to the microstructures 2520 of the mask layer 2500;

step S43, curing the silica gel layer 2420 on which the plurality of three-dimensional microstructures 2410 are formed; and step S44, removing the mask layer.

It may be appreciated that the method for forming the three-dimensional microstructure may also be a molding method or a hot-pressing film method, or any other method by which the three-dimensional microstructure can be formed, the present application cannot be exhaustive due to limited text. In the molding method, a silica gel layer containing a fish scale-like three-dimensional microstructure is formed on a circuit substrate containing an LED chip and a reflective film by directly using the mold forming technology. The hot-pressing film method includes two steps: first, forming a silica gel layer containing a fish scale-like three-dimensional microstructures by the molding method, and then hot pressing the silica gel layer on the circuit substrate. A molding machine is required in both of the above methods. Generally, the molding machine is expensive, therefore an investment in large-scale production is relatively high.

Therefore, taking a printing method as a specific example, a method for forming a three-dimensional microstructure will be described in the present application.

Firstly, fish scale-like three-dimensional microstructures are formed on the surface of the backlight source according to requirement, and a three-dimensional printing halftone is designed and manufactured. An upper surface of an inner wall of the printing halftone is provided with a plurality of microstructures and a plurality of openings. In the case that a planar light-emitting surface needs to be manufactured, the inner wall of the upper surface of the printing halftone has a planar structure, and at least one opening is formed in the upper surface. The outer frame of the printing halftone serves as support and closure, and the height of the outer frame determines the final thickness of the layer of silica gel. This printing halftone is independent of the printing machine.

Secondly, the printed circuit substrate, to which the chips are fixed and the reflective film is attached, is aligned with and fixed to the printing halftone. For example, the printed circuit substrate is bonded to the printing halftone by using UV adhesive tape, and the printing halftone, to which the printed circuit substrate is accurately aligned and fixed, is placed on a printing machine. Silica gel, functioning as a printing paste, is pressed by a scraper of the printing machine into the printing halftone through the opening of the printing halftone. The scraper may go back and forth, till the printing halftone is filled with the silica gel.

Thirdly, after the printing is completed, the printing halftone, together with the printed circuit substrate, is heated or irradiated with ultraviolet light, and the silica gel is initially cured. In particular, the selection of heat curing or UV curing depends on the material of the silica gel. The apparatus used for curing the silica gel may be integrated on the printing machine or may be a separate apparatus.

Further, in order to enable the cured silica gel to be smoothly stripped from the printing halftone, it is necessary to coat the printing halftone with a special coating or spray a release agent on the printing halftone before printing. After separation, desired fish scale-like three-dimensional microstructures are formed on the surface of the silica gel layer on the printed circuit substrate. Finally, the silica gel is further completely cured according to the characteristics of the silica gel to complete the manufacture of the integrated backlight.

In this embodiment, the step of providing the silica gel layer 2420 and the plurality of three-dimensional microstructures 2410 on the LED chips includes providing the mask layer 2500 on the plurality of LED chips 2200, the mask layer 2500 having the plurality of through-holes 2510 and the microstructures 2520; forming the silica gel layer 2420 on the LED chips 2200 through the plurality of through-holes 2510, and forming the plurality of three-dimensional microstructures 2410 on the surface of the silica gel layer 2420 and at positions corresponding to the microstructures 2520 of the mask layer 2500; curing the silica gel layer 2420 on which the plurality of three-dimensional microstructures 2410 are formed; removing the mask layer 2500. The plurality of three-dimensional microstructures 2410 are configured to disperse the light exiting from the silica gel layer 2420 and change the directions thereof, so that the backlight 210 emits uniform light.

An embodiment of the present application further provides a liquid crystal display including a display panel and the backlight of any one of the above embodiments. In an embodiment, the liquid crystal display includes a display panel and a backlight including a circuit substrate, a plurality of LED chips, a first silica gel layer, and/or a phosphor layer. The liquid crystal display can emit light uniformly, provide a better visual experience for the user, and has a thin thickness and good aesthetic appearance.

Each of the technical features in the described embodiments may be combined arbitrarily. For the sake of brevity, not all possible combinations of each of the technical features in the described embodiments are described. However, the combinations of these technical features should be considered to be within the scope of the present description as long as they do not contradict each other.

The described embodiments represent only a few examples of the present application, and the descriptions thereof are more specific and detailed, but not therefore to be construed as limitation of the scope of the application. It should be noted that various variations and modifications may be made by those of ordinary skill in the art without departing from the conception of the present application. Accordingly, the protection scope of the present application should be defined by the appended claims.

What is claimed is:

1. A backlight, comprising:
   a circuit substrate;
   a plurality of LED chips, the plurality of LED chips being fixed by means of die bond on the circuit substrate;
   a first silica gel layer, the first silica gel layer being applied to the circuit substrate and wrapping the plurality of LED chips;
   a phosphor layer applied to the first silica gel layer, the phosphor layer having a thickness less than 0.15 mm; and
   a second silica gel layer disposed on the phosphor layer, the second silica gel layer being a silica gel layer mixed with diffusion powder;
   wherein a surface of the first silica gel layer is flat, the surface of the first silica gel layer comprises a pattern of trenches, and a depth of each of the trenches is less than 0.05 mm.

2. The backlight according to claim 1, wherein the first silica gel layer has a silica gel refractive index greater than 1.4, and the first silica gel layer has a thickness greater than 0.2 mm.

3. The backlight according to claim 1, wherein a length of each LED chip is less than 0.5 mm; a width of each LED chip is less than 0.5 mm; and a height of the LED chip is less than 0.2 mm.

4. The backlight according to claim 1, wherein the plurality of LED chips are fixed in an array by means of die bond on the circuit substrate.

5. The backlight according to claim 1, wherein a distance between adjacent chips of the plurality of LED chips is less than 5 mm.

6. The backlight according to claim 1, wherein a thickness of the circuit substrate is less than 0.5 mm.

7. A backlight, comprising:
   a circuit substrate;
   a plurality of LED chips disposed on the circuit substrate;
   a reflective film disposed on the circuit substrate and comprising a plurality of openings corresponding to the plurality of LED chips; and
   a diffusing layer disposed on the plurality of LED chips, the diffusing layer comprising a silica gel layer and a plurality of three-dimensional microstructures disposed on a surface of the silica gel layer, and the surface of the silica gel layer being away from the LED chip, wherein the silica gel layer is a transparent organosilica gel layer or an organosilica gel layer mixed with phosphor or quantum dots, and a thickness of the silica gel layer is between 0.1 mm and 1 mm.

8. The backlight according to claim 7, wherein a reflectivity of the reflective film is greater than 90%, and a material of the reflective film comprises a polymer or a metal.

9. The backlight according to claim 7, wherein the plurality of LED chips are distributed in a rectangular array, a circular array, or a special-shaped array on the circuit substrate.

10. The backlight according to claim 9, wherein a distance between any two adjacent LED chips of the plurality of LED chips is between 0.1 mm and 10 mm.

11. The backlight according to claim 7, wherein the LED chip has a length of between 0.05 mm and 0.5 mm, a width of between 0.05 mm and 0.5 mm, and a thickness of between 0.05 mm and 0.3 mm.

12. A liquid crystal display, comprising a display panel and the backlight according to claim 1.

13. A method for manufacturing the backlight according to claim 7, comprising:
   providing the plurality of LED chips on the circuit substrate;
   providing the plurality of openings in the reflective film corresponding to the plurality of LED chips;
   providing the reflective film on the circuit substrate; and
   providing the silica gel layer and the plurality of three-dimensional microstructures on the LED chips.

14. The method for manufacturing the backlight according to claim 13, the providing the silica gel layer and the plurality of three-dimensional microstructures on the LED chips comprises:
   providing a mask layer on the LED chips, the mask layer having a plurality of through-holes and microstructures;
   forming the silica gel layer on the LED chips through the plurality of through-holes, and forming the plurality of three-dimensional microstructures on a surface of the silica gel layer and at positions corresponding to the microstructures of the mask layer;
   curing the silica gel layer, on which the plurality of three-dimensional microstructures are formed; and
   removing the mask layer.

* * * * *